(12) United States Patent
Schattenburg et al.

(10) Patent No.: US 10,503,083 B2
(45) Date of Patent: *Dec. 10, 2019

(54) APPARATUS AND METHOD FOR USING SCANNING LIGHT BEAM FOR FILM OR SURFACE MODIFICATION

(71) Applicant: Lithoptek LLC, Summit, NJ (US)

(72) Inventors: Mark Schattenburg, Framingham, MA (US); Rudolf Hendel, Summit, NJ (US); John Glenn, Carlisle, MA (US)

(73) Assignee: Lithoptek LLC, Summit, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/166,729

(22) Filed: Oct. 22, 2018

(65) Prior Publication Data

US 2019/0056675 A1  Feb. 21, 2019

Related U.S. Application Data

(63) Continuation of application No. 15/253,016, filed on Aug. 31, 2016, now Pat. No. 10,108,096.

(60) Provisional application No. 62/212,013, filed on Aug. 31, 2015.

(51) Int. Cl.
*G03F 7/20* (2006.01)

(52) U.S. Cl.
CPC ...... *G03F 7/70775* (2013.01); *G03F 7/70383* (2013.01); *G03F 7/70558* (2013.01)

(58) Field of Classification Search
CPC ............ G03F 7/70075; G03F 7/70116; G03F 7/70125; G03F 7/70516; G03F 7/70775
USPC ........................................ 355/52, 53, 67–71
See application file for complete search history.

(56) References Cited

U.S. PATENT DOCUMENTS

| | | | | |
|---|---|---|---|---|
| 9,645,391 B2* | 5/2017 | deVilliers | ......... | H01L 21/67248 |
| 10,108,096 B2* | 10/2018 | Schattenburg | ...... | G03F 7/70775 |
| 2012/0084044 A1* | 4/2012 | Dmitriev | ................ | B82Y 10/00 |
| | | | | 702/127 |
| 2013/0288167 A1* | 10/2013 | He | ...................... | G03F 7/70141 |
| | | | | 430/30 |

* cited by examiner

*Primary Examiner* — Hung Nguyen
(74) *Attorney, Agent, or Firm* — Stroock & Stroock & Lavan LLP

(57) ABSTRACT

A method and apparatus for treating a substrate and, in particular, making secondary adjustments to the results of a primary process applied to the substrate, leading to improved uniformity of the overall process, in which a substrate is positioned on a substrate holder; a scanning a beam of light is directed onto the surface of the substrate; and the amplitude of the scanned beam is varied by location based on a substrate signature.

40 Claims, 6 Drawing Sheets

APPARATUS AND METHOD FOR USING SCANNING LIGHT BEAM FOR FILM OR SURFACE MODIFICATION

CROSS-REFERENCE TO RELATED APPLICATIONS

This application is a continuation of and claims priority under 35 U.S.C. § 120 to U.S. patent application Ser. No. 15/253,016, filed on Aug. 31, 2016, which issued as U.S. Pat. No. 10,108,096, which claims the benefit of U.S. Provisional Application No. 62/212,013, filed on Aug. 31, 2015, entitled "Apparatus and Method for Using Light Beam for Film or Surface Modification," all of which are incorporated herein by reference in their entirety.

TECHNICAL FIELD

The present invention relates, generally, to film or surface modification and, more particularly, to an apparatus and method using a scanning beam of light for the purpose of energy deposition for film or surface modification. The invention applies, as one example, to the secondary adjustment of process parameters leading to improved uniformity of the overall process.

BACKGROUND

A critical requirement of advanced semiconductor processing and a key measure of process capability is a tight uniformity of the process parameters, such as uniformity of the smallest feature dimensions in a circuit, or the smallest space, commonly referred to as the Critical Dimension (CD); or the uniformity of alignment between different patterning layers in a circuit, commonly referred to as Overlay (OL) over the entire wafer area. This requirement becomes increasingly challenging given the continued reduction of feature sizes required through scaling (the industry claims to be at the 10 nm Technology Node now) and the increasing size of wafers (currently at 300 mm diameter with 450 mm diameter expected in the near future). For example, if the critical dimension (CD), which is indicative of the minimum feature size of a pattern, is only a few tens of nanometers, and the requirement is for a <5% variation of CD, then the process control must deliver CD which varies <1 nm. The control of any process to that degree of accuracy is very challenging. For this reason, a secondary adjustment of the results of a primary process (in this case, CD) is desirable. This means that the primary process (for example, a photolithographic exposure process or a substrate etch process) is performed and the result obtained from that process does not satisfy the final process control requirement, thus requiring a secondary adjustment to the primary process.

For example, a photolithographic exposure process may be performed using an optical transfer of a circuit pattern from a photomask onto a silicon wafer using a projection lithography exposure. In semiconductor patterning processes, prior to exposure, substrates are typically coated with a photosensitive polymer (photoresist) which is altered by exposure to radiation as provided by the projected image of a photomask. The projected energy pattern, as absorbed into the photoresist, alters the film material so that it can be selectively removed in a subsequent chemical development process. The developed resist can then, for example, be used as a mask during a subsequent etch process to transfer the photoresist pattern into the underlying substrate for the purpose of generating circuit patterns. The photomask pattern, and the characteristics of the photolithographic projection system, are carefully designed to deliver an image with controlled CD to each location on the wafer. However, many process variations, such as projection illumination uniformity in the image projection system, or photoresist thickness variations during coating processes, may cause deviations of the CD from target values. These deviations can degrade circuit performance and can be difficult to control.

The CD uniformity of patterns on semiconductor substrates can be obtained using CD mapping tools provided by several vendors such as KLA-Tencor (Optical CD metrology) or Applied Materials (SEM CD metrology). These tools are capable of measuring circuit pattern CD at many points on the substrate, thereby generating a 2D map of CD errors across the substrate. In many cases, measured CD maps display a great deal of repeatability from one substrate to the next. Repeatable patterns are signatures of particular processes or process tools which were used to generate the pattern. Such repeatable patterns are referred to as substrate signatures. A substrate signature is mostly determined by the specific semiconductor processing equipment used to process the wafer. Thus, if the equipment used for substrate processing is altered or replaced, the substrate signature may also be altered and may need to be re-measured.

The substrate signature is typically represented by a 2D map of CD errors as measured in nanometer units. This is called a substrate signature map. This map can be used for the purpose of CD error compensation through a secondary adjustment of the primary (exposure) process by location dependent pre-exposure or post-exposure dosing adjustment. For the case of secondary adjustment of the exposure process, the amount of pre- or post-exposure correction required for each position in the substrate signature map may be measured and stored, forming a predetermined 2D correction map which can be applied to subsequent substrates for the purpose of correction. For the case of secondary adjustment of the exposure process, the substrate signature map, typically representing CD error as a function of position in nanometer units, may need to be processed into a substrate correction map, which typically represents deposited energy per pixel, for the purpose of exposing a photoresist film, as a function of pixel position (e.g., in units of milli-Joules), or alternatively, deposited energy per area as a function of pixel position (e.g., in units of milli-Joule/$cm^2$). In this example, the process of transforming a substrate signature map into a substrate correction map requires knowledge of photoresist photochemical exposure parameters which are typically available from photoresist vendors.

Typically, the substrate signature map is a substantially repeatable map of process control variations characteristic of particular pieces of equipment or individual process steps applied to semiconductor substrates. Other processing steps, such as the application of photopolymers or deposition and etching of thin films on the substrate, may also exhibit substrate signatures which can be measured and compensated through secondary adjustment. For the case that a substrate signature is caused by thermal characteristics of a process step, for example a baking or etching step, which cause undesirable process variations, for example CD variations, the thermal or energy signature of the process may be measured and applied to the substrate for the purpose of secondary adjustment. For the case of secondary adjustment of a thermal or energy process, the substrate signature map may be measured and stored, forming a predetermined thermal input signature which can be applied to subsequent substrates for the purpose of correction. For the case that a substrate signature is caused by thermal characteristics of a process step, the substrate signature map, typically representing CD error as a function of position in nanometer units, may need to be processed into a substrate correction map, which typically represents deposited energy per pixel into a substrate, for the purpose of altering local temperature, as a function of pixel position (e.g., in units of milli-Joules), or alternatively, deposited energy per area as a function of pixel position (e.g., in units of milli-Joule/cm$^2$). In this example, the process of transforming a substrate signature map into a substrate correction map would require knowledge of the local temperature rise that is necessary to effect a particular CD target.

U.S. Patent Publication Nos. 2015/0147827 A1, 2015/0146178 A1, 2015/0212421 A1, and 2016/0048080 A1, each to deVilliers et al. (henceforth collectively referred to as "deVilliers") address such a secondary adjustment for a number of processes, including CD-uniformity. DeVilliers describes achieving the secondary adjustment by projecting a modulated intensity map onto the wafer using a spatially modulated array, such as a commercially available micromirror micro-electromechanical systems (MEMS) device. Such micro mirror arrays (MMA) are frequently called "Digital Light Processors (DLP)" or "Grating Light Valves (GLV)" and are commonly used in digital motion picture projectors. Since the images so projected are in the visible light spectrum, commercially available MMAs are optimized for the visible band of electromagnetic radiation (between 400 nm and 800 nm). The majority of the applications in need of adjustment in semiconductor processing require shorter wavelengths. Wavelengths of 193 nm and 248 nm are typical. However, light at this shorter wavelength is more energetic than visible light and is capable of damaging certain MMA devices.

FIG. 1 depicts a projection imaging system for a digital light processor of the type described in deVilliers. Light from a radiation source 101, for example a light emitting diode device (LED) emitting UV radiation, is collimated by lens 102 into beam 103 which substantially uniformly illuminates MMA device 104. MMA device 104 is driven with the desired patterns by an electronic system (not shown). Lens 107 forms an image of said MMA pattern onto substrate 109 which is chucked to substrate holder 111. In the figure, the MMA pattern is shown to generate an image beam 106 from exemplar point 105 on MMA device 104, which is then projected onto corresponding point 110 on substrate 109 via projection beam 108 by means of projection lens 107. In turn, many other exemplar points on MMA device 104 will be found to project to corresponding points on substrate 109, in a manner consistent with well-known imaging optics. With this method, the entire pattern generated by MMA device 104 is projected simultaneously to a corresponding image on substrate 109. Depending on the focal length of lens 107, the distance of lens 107 to MMA device 104, and the distance of lens 107 to substrate 109, the image on substrate 109 may be reduced or magnified in size with respect to the image on MMA device 104, following well-known principles of lens theory.

The general use of scanning light beams to process substrates, for example using a beam generated by a laser, is known in the art. Many methods of using scanned laser beams for surface patterning or modification have been described in the art. A typical application modifies surfaces or surface films by melting or ablating the material, for example, to provide annealing or to achieve small surface relief features.

One of the earliest commercial applications of lasers was a production laser cutting machine used to drill holes in diamond dies, made by the Western Electric Engineering Research Center (1965). In 1967, the British pioneered laser-assisted oxygen jet cutting for metals. In the early 1970s, laser technology was put into production to cut titanium for aerospace applications. There are many different methods for cutting using lasers, with different types used to cut different materials. Some of the methods are vaporization, melt and blow; melt, blow and burn; thermal stress cracking; scribing; cold cutting; and burning stabilized laser cutting. For a summary of these methods, see https://en.wikipedia.org/wiki/Laser_cutting.

In semiconductor manufacturing, commercial laser processing tools (for example, the Ultratech LSA100A) provide solutions to the difficult challenge of fabricating ultra-shallow junction and highly activated source/drain contacts. Laser Spike Annealing (LSA) operates at near-instantaneous timeframes (micro-seconds) at temperatures up to 1,350° C. At these temperatures, nearly full activation of dopants with minimal diffusion is achieved in micro-seconds timeframes. The laser beams can also provide chemical modification or induce chemical removal or deposition to occur on the substrate or to thin films applied thereon. The ability of lasers to accurately deliver large amounts of energy into confined regions of a material allow the modification of surface chemistry, crystal structure, and/or multiscale morphology without altering the bulk. A summary of such applications is contained in Chapter 13 of Laser Precision Microfabrication; Editors: Koji Sugioka, Michel Meunier and Alberto Piqué; ISBN: 978-3-642-10522-7 (Print), 978-3-642-10523-4 (Online), 2010.

A process called scanning photolithography, for example, alters the surface or chemistry of a surface film on a substrate so that a subsequent step may remove or otherwise reveal surface topography or features. For example, scanning photolithography is used in the production of photomasks where it generates arbitrary patterns for subsequent replication onto substrates using the well-known processes of contact or projection photolithography. The Applied Materials ALTA® 4700 Mask Pattern Generation system, introduced in 2004, provided the industry with mask layers for 90 nm and most 65 nm critical levels. This system, the laser-based DUV ALTA 4700, featured a 42×, 0.9 NA objective lens, providing superior mask resolution, pattern fidelity, critical dimension control and placement performance. See http://www.appliedmaterials.com/company/news/press-releases/2004/11/applied-materials-new-alta-4700-laser-mask-writer-takes-on-65 nm-critical-layer-manufacturing. The Applied Materials technology is described in, for example, U.S. Pat. Nos. 5,386,221 and 7,483,196B2.

Alternatively, Swedish company Mycronic, AB is applying scanning photolithography to display technology and to advanced electronic packaging applications. This technology is described in, for example, U.S. Pat. No. 8,822,879B2 and in U.S. Patent Application Publication No. US20150125077A1.

Prior to applying scanning photolithography to display technology and advanced electronic packaging applications, Mycronic (under the name of Micronic) applied scanning photolithography to the manufacturing of mask layers. This technology is described in, for example, U.S. Pat. Nos. 6,624,878B1; 7,446,857B2 and 8,958,052B2.

During scanning photolithography, a focused beam of UV light is scanned and directed onto a thin film, called a photoresist or resist, which is then modified by the light (or exposed) resulting in high resolution micro- or nano-scale patterns. Here, the UV light chemically modifies the film by breaking or cross linking bonds in resist molecules. During a subsequent chemical development process, the exposed regions of the film, for the case of a positive photoresist, are chemically removed, whilst the regions of the photoresist film not exposed remain. In the case of a negative photoresist, the regions which received no exposure are chemically removed and regions which receive exposure remain. An example of such a beam scanning tool for the purpose of exposing substrate films with arbitrary patterns using UV light beams is the ALTA photomask patterning tool manufactured by Applied Materials, Inc. That tool uses a spinning polygonal mirror wheel to scan beams across a substrate.

Such beam scanning schemes typically seek to produce an array of patterns on a substrate, with said patterns comprised of features in various sizes ranging from small to large. There is a strong desire to make the minimum features as small as possible. In prior art scanning, the minimum feature size is typically similar, or slightly larger, than the size of the beam. For laser beam surface patterning, a desired minimum surface feature may be broken into a small number of pixels (between four and nine for example). Typically in this case the minimum size feature that is being patterned by the beam is the same size or larger than the beam spot size on the substrate. For example, a scanning beam spot of 1 micrometer diameter can be used to produce arbitrary patterns on a substrate, said patterns placed at arbitrary locations, with a minimum feature size of approximately 3 micrometers.

Energy input into a substrate or substrate film by a beam or image is generally referred to as "dose," which is typically indicated or measured in units of energy per square area, for example, $mJ/cm^2$.

In general, there are two main types of beam scanning techniques: vector scanning and raster scanning. During vector scanning, patterns on the substrate are generated by using a beam steering method that moves the beam on the substrate from one arbitrary point A to a second arbitrary point B. During scanning, the beam may be "blanked"—or rapidly turned on and off—before, during, or after the motion from point A to B, in order to achieve a desired energy input pattern into the substrate. In the vector scanning method, after a path from point A to point B is defined, subsequent scanning defines a path from point C to point D, E to F, etc., in rapid succession until the entire desired pattern is written.

During raster scanning, on the other hand, the beam is swept rapidly back and forth across the substrate in one direction, whilst being swept slowly across the substrate in an orthogonal direction, so that after some time the beam has traversed all points on the substrate. During this scanning process, the beam is rapidly blanked (i.e., turned and off) under electronic control so that the desired pattern is transferred to the substrate.

Some writing strategies combine both, vector and raster scanning (see for example U.S. Patent Application Publication No. US20070075275).

In general, for both scanning schemes, it is desired that the beam on/off switching time (i.e., blanking time) be sufficiently short during laser beam writing, such that the scanning spot will impart a sufficiently small minimum region of the substrate with energy input. Thus, if the blanking time is sufficiently short, the size of the resulting minimum features will be comparable to the size of the beam. We refer to the minimum imparted energy spot width on the substrate resulting from said fast blanking step as the down-track pixel size. It is desired that the down-track pixel size and the beam diameter be comparable in size in order to achieve the optimal minimum possible feature size on the substrate. In this case the minimum feature will resemble a dot or disk. Said minimum feature size can be measured using a 1D or 2D criteria (for example, using a full-width-at-half-max criteria). The minimum feature size is typically referred to as the critical dimension (CD).

SUMMARY

As described herein, scanning beams of light are used, not for the purpose of writing minimum feature sizes (CD) in a primary process, as in the case of prior art, but rather to impart energy into regions of the substrate for the purpose of a secondary adjustment of a primary process in order to satisfy a final process control requirement. For example, scanning beams have been applied to semiconductor wafer photolithographic processing for the purpose of photomask patterning, but generally not directly applied to patterning semiconductor substrates. Here, the process of photolithographic replication of a photomask mask pattern onto a semiconductor substrate is a primary process; the use of scanning beams of light for the purpose of CD correction is a secondary adjustment of a primary process. For the case of a secondary adjustment of a photolithography process, the scanning beam may be used to impart UV light energy into a photoresist film for the purpose of CD correction. For the case of a secondary adjustment of an etching or baking process, the scanning beam may be used to impart visible or infrared light energy into the surface or surface film for the purpose of CD correction.

Also described herein is the use of scanning beams of light, as an alternative to using projected light energy, for the purpose of secondary adjustment of a primary process. The use of light sources which are traditionally applied to semiconductor patterning on wafers (e.g., excimer lasers with 193 nm and 248 nm wavelengths) using projected light energy for the purpose of secondary adjustment of a primary process, are not preferred for use in scanning beam applications for two main reasons. First, their pulse rates (kHz range) are typically too slow for the scanning beam applications, such as the secondary adjustments of a primary process described herein. A typical substrate signature correction map may contain more than 200,000 pixels. Delivering just one pulse per pixel at a 2 kHz pulse rate would take 100 seconds to expose the entire wafer surface for modification and therefore limit the productivity to 37 wafers per hour, before considering overhead times of loading, unloading and aligning the wafer. Laser pulse-to-pulse variations may further require multiple pulses per pixel. Assuming the need for 100 pulses per pixel would reduce the productivity to less than 1 wafer per hour, unacceptably slow for any commercial applications. Second, in addition to setting severe constraints for the speed in which substrates can be processed, the slow pulse rate further limits the resolution of the adjustment that can be affected, and the high pulse intensities of such lasers lead to undesired thermally-induced alteration or damage of photoresist films. In contrast, this disclosure teaches the use of alternative types of lasers for the purpose of applying scanning beams of light, which avoid these problems.

BRIEF DESCRIPTION OF THE DRAWINGS

Embodiments of the invention will now be described with reference to the accompanying drawings, in which.

DETAILED DESCRIPTION OF EMBODIMENTS

Figure 1:
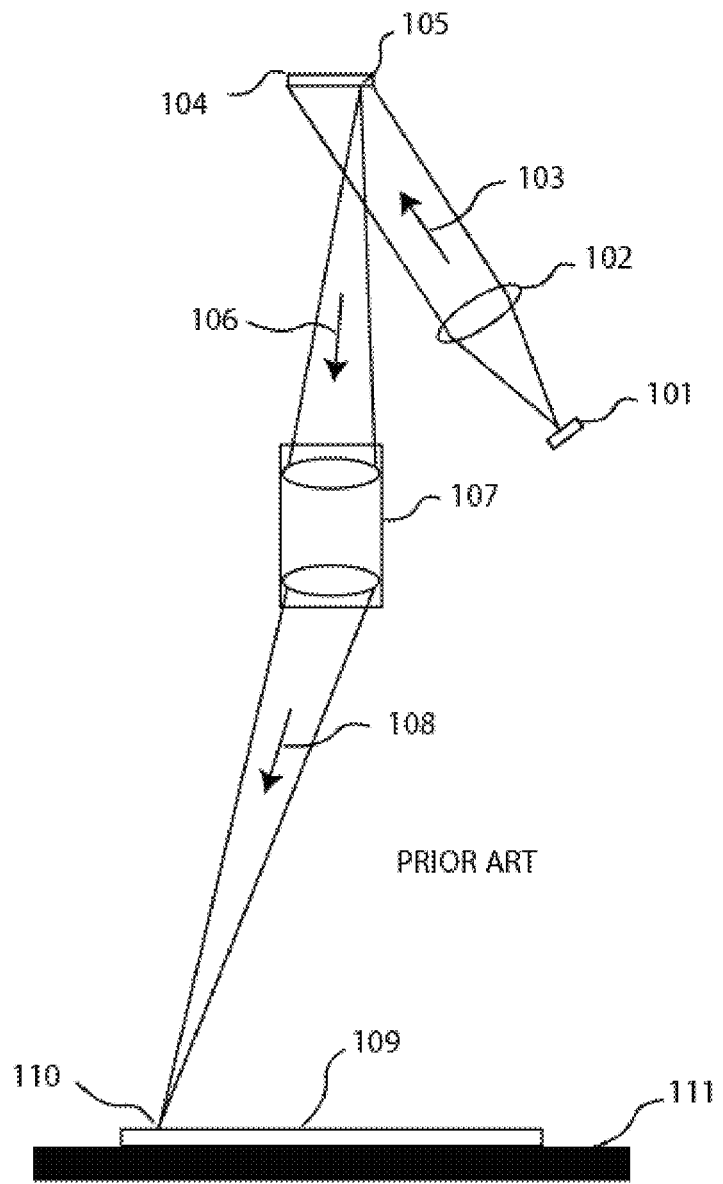
FIG. 1 is a depiction of a prior art projection imaging system.

The techniques disclosed herein use a scanned beam to provide varying levels of light energy to a surface in order to effect a useful result in the secondary adjustment of process parameters in semiconductor manufacturing—for example, to provide UV energy to certain areas for the purpose of tightening CD control.

A prior art method taught by deVilliers projects a modulated intensity map in order to adjust for parameter variations. During pixel imaging, the entire wafer, or a substantial portion of a wafer, is imaged at once from an active pixel device using an optical projection system. The active pixel imaging device may be a micro mirror device. Projected pixel-imaging based approaches may require complex and expensive optical projection systems, and may be difficult to achieve with commercially available pixel imagers due to wavelength or intensity restrictions. Finally, they may require a larger volume of space and/or a more expensive system than is commercially attractive.

As described herein, a scanning beam approach provides the desired result yet avoids the use of a projected pixel imaging device. Instead, a mechanical or electro-optical scanning device, called a scanner, causes a beam, or a small number of beams, to traverse the substrate serially. In various embodiments, the scanner may use the following kinds of well-known scanning devices, used singly or in combination:

Spinning multi-faceted mirror, such as a hexagonal mirror;
  Galvanometer scanning mirror;
  Acousto-optic modulator beam deflector;
  Electro-optic modulator beam deflector;
  MEMS scanning mirror; and
  Piezo electric scanning mirror The techniques discussed herein may use a continuous wave (CW) laser source or a pulsed laser source. However, for the case of practicing the invention in the ultra-violet (UV) range, CW tools may have some disadvantages.

CW lasers in the UV range tend to be bulky and expensive because of the need to start with relatively long wavelength light which is subsequently beam wavelength divided, also called frequency multiplication or frequency conversion. This technique is a commonly practiced method of converting long wavelength laser beams to shorter wavelength beams in the UV range. (Note that from physics principles, wavelength and frequency are inversely related and can be equivalently discussed.) The frequency multiplying conversion process is preferred since long wavelength beams of high intensity and excellent beam quality can be inexpensively generated, for example by using a diode-pumped solid state (DPSS) laser operating in the 1-2 micron wavelength band.

The preferred method for frequency conversion of DPSS laser beams and other kinds of laser beams utilizes so-called frequency doubling or frequency mixing crystals which convert laser beams from long to short wavelengths (see, for example, Chapter 12 in "Optical Waves in Crystals," A. Yariv and P. Yeh, Wiley-Interscience, 1984). These devices increase their efficiency strongly as the beam intensity increases. Since CW beams typically have a low intensity, the frequency multiplying process is inefficient, which results in light loss and heat generation. For this reason, CW lasers which incorporate frequency conversion tend to be large, expensive and inefficient.

An alternative to a CW laser is a pulsed laser, for example a Q switched laser. For a given laser average power level, a pulsed laser will more efficiently convert long wavelength photons to short wavelength due to the high peak intensity of the beam during pulsing. For this reason, pulsed lasers which incorporate frequency conversion tend to be more compact, less expensive, and more efficient than CW laser of similar average power.

Pulsed or CW laser beams can readily be used in pixel-image based projection schemes. However, it is more problematic to use pulsed beams from some UV lasers with beam scanning to pattern a substrate for the same purpose, for the reason that as the beam rapidly scans across the substrate, the pulsed beam will only be on for brief periods, so that only isolated islands of the substrate will be exposed. In addition, even if the scanning speed is slow enough, or the beam large enough, such that every portion of the substrate will see at least one laser pulse, if only a few pulses expose a given area of the substrate, the statistical control of energy deposited (mJ/cm$^2$) may be poor. This is partly because pulsed lasers tend to have some amount of pulse-to-pulse energy jitter, typically between 1% and 5%. Averaging over longer strings of pulses results in improved average dose with lower statistical fluctuation. It is preferable to have low dose fluctuation during patterning, in order to control CD variation. In order to increase productivity and reduce cost, it is preferable to have a rapid writing process and very low statistical deviation of energy deposition. For this reason, certain common pulsed laser beams may not, in some circumstances, be preferred for beam scanning to pattern a substrate as described herein.

For example, a type of laser that is often used for UV and deep UV photolithography is the excimer laser, which is commercially available, for example, with typical wavelengths of 305 nm, 248 nm, 193 nm and 157 nm. These lasers have a pulse rate of a few kilohertz, for example, 5 kHz, and a pulse width of nanoseconds, for example 10 ns. Consider a semiconductor production process which may involve a pulsed excimer beam moving on a substrate, for example a 300 mm diameter silicon wafer, where it is desired to have a scanning process where a 0.3 mm diameter beam is scanned across the substrate for the purpose of energy deposition. For this application the wafer can be divided into 0.3 mm diameter spots, or pixels. For 1% control of exposure dose, it may be desired to have at least 100 pulses per pixel. For the entire wafer this implies a total on the order of $100*(30 \text{ cm}/0.03 \text{ cm})^2 = 10^8$ pulses. For an excimer pulsing at 5 kHz such a wafer exposure will take 20,000 seconds. However, for semiconductor processing, there are commercial reasons to desire completion of total wafer exposure in under 60 seconds, or even under 10 seconds.

In another example, a type of laser called a Q-switched solid-state laser is considered. This type of laser typically pulses with frequencies between 5 and 100 kHz, and typically has a pulse width of several tens of nanoseconds. Laser average power for this type of laser is typically peaked for pulse frequencies between 30-50 kHz. For example, consider a semiconductor production process which may involve a pulsed Q-switched beam moving on a substrate, for example a 300 mm diameter silicon wafer, where it is desired to have a scanning process where a 0.3 mm diameter beam is scanned across the substrate for the purpose of energy deposition. For this example, as in the previous example, the wafer will require on the order of $10^8$ pulses. For a Q-switched laser pulsing at 50 kHz the wafer exposure will take 2,000 seconds. Again, however, for semiconductor processing, there are commercial reasons to desire completion of total wafer exposure in under 60 seconds, or even under 10 seconds.

Finally, in another example, a type of laser called the mode locked laser is considered. This laser is designed such that it typically pulses at a many megahertz rate, for example 100 MHz or even 1 GHz. Consider a semiconductor production process which may involve a pulsed mode-locked beam moving on a 300 mm diameter silicon wafer, where it is desired to have a scanning process where a 0.3 mm diameter beam is scanned across the substrate for the purpose of energy deposition. In this example, similar to the previous example, the wafer will require on the order of $10^8$ pulses. For a mode locked laser pulsing at 100 MHz the wafer exposure will take 1 second. Such a short exposure time allows for a high rate of production. For this reason, a mode locked laser is often the preferred choice for pulsed beam scanning processes in accordance with embodiments of the present invention, although other types of lasers can be used too if lower productivity (system throughput) is commercially acceptable for the application considered.

Many methods of blanking a beam, in particular, blanking a scanning beam, are known to those skilled in the art. As normally practiced, a beam of particular intensity scanning over a substrate may be blanked over certain areas, which receive no (or low) power, and unblanked over other areas, which receive 100% power. This results in a binary pattern generated on the substrate. However, in accordance with an embodiment of the present invention, rather than a binary pattern, it is desired to have a grey scale pattern, wherein each area of the substrate receives a desired level of deposited energy. We call this process beam grey scale blanking (GSB). For a GSB process to be successful, it must be able to control the quantity of energy deposited into each pixel to a precision required by a particular application, as well as being able to transition the beam between desired power levels at a speed sufficient to keep pace with the rate at which the beam transits between pixels. For example, if a substrate has been divided into $10^6$ pixels, and it is desired to scan the substrate in 10 seconds, then the GSB technique must be able to transition the beam between discrete power states in a time small compared to $10/10^6$ seconds, or less than 10 micro seconds, for example, 1 micro second.

For the case of a CW laser, there are several ways of accomplishing GSB. One method, called intensity modulation, utilizes an optical device which is capable of rapid changes of transmission or reflection of a beam. For example, an acousto-optic modulator, an electro-optic modulator, a liquid crystal modulator, or a MEMS-based modulator may be used for this purpose. An acousto-optic modulator ("AOM") device, for example, will transmit a so-called first order beam, wherein the intensity of said beam is proportional to the RF power being applied to the device. AOM devices are capable of transitioning between beam power transmission levels in a time small compared to 1 micro second.

Another method of accomplishing GSB for a CW beam is called pulse width modulation (PWM). In this case a blanking device is used which is capable of 0% (or minimum) or 100% (or maximum) transmission of the beam, at a time scale smaller than the transit time between pixels. For example, an acousto-optic modulator, an electro-optic modulator, a liquid crystal modulator, or a MEMS-based modulator may be used for this purpose. At each pixel location, the beam is transitioned and controlled to the maximum state for a time that is a desired percentage of the transit time between pixels. For example, if a particular pixel is desired to have a dose of fraction F with respect to the maximum dose, and a beam transits between pixels in time T, then during the time the beam is substantially over a pixel, also given by T, the beam should be modulated in time so that it dwells at a maximum intensity for time T*F and at a minimum intensity for a time T*(1−F). In this case, the blanking modulator must be able to transition between minimum and maximum states at a rate that is much faster than the transition time between pixels. For example, if it is desired to obtain a control of pixel dose between minimum and maximum dose values with a fractional precision of D, then the speed of transition between minimum and maximum states must be faster than D*T.

Beam blanking devices for PWM may be used in conjunction with a pulsed laser, such as a Q switched or mode locked laser. However, some Q switched or mode locked lasers utilize an internal beam blanking device in order to gate the rate of generated pulses. For example, an Acousto-Optical Modulator (AOM) or Electro-Optic Modulator (EOM) device may be utilized internally in the laser for this purpose. In this case, an external beam blanking device, for the purpose of PWM dose control during laser scanning, may be avoided if the laser provides means of control of its internal beam blanking component, for example provided by an external electronic signal.

Pulsed beams, for example provided by a mode locked laser, may be gray-scale blanked either by the intensity or PWM modulation schemes. However, particular attention must be paid to the relative difference between the time between laser pulses and the transit time of the beam between pixels. When using intensity modulation with a pulsed beam, for example, it is desired to have at least one pulse per pixel. In the case that a small number of pulses are allocated to each pixel, the rate of intensity modulation transitions, as gated by the pixel rate, must be carefully synchronized with the rate of laser pulses so that each pixel receives an identical number of pulses. If this condition is violated, then unacceptable jitter in pixel dose may result. Use of PWM with a pulsed beam is preferred if a large number of laser pulses occur during the transit time between pixels. If a small number of laser pulses occur during the pixel transit time, then it may be difficult to achieve good dose control unless precise synchronization is achieved between the pixel rate and pulse rate. This is due to the very short duration of individual laser pulses, such that a PWM modulation device may choose individual laser pulses but may have difficultly choosing a fractional laser pulse. For example, if a laser produces 10 pulses in the time it takes the beam to transit one pixel, then the granularity of pixel dose control when using PWM modulation could be 10% in the case that precise synchronization is not achieved. This will result in poor dose control.

On the other hand, if the laser pulse rate is sufficiently high such that a large number of pulses occur during the pixel transit time, then pixel dose jitter will be small when using the PWM scheme, even in the absence of precise synchronization. For example, if a laser produces 1000 pulses in the time it takes the beam to transit one pixel, then the granularity of pixel dose control when using PWM modulation will be 0.1%.

When using the intensity modulation technique with a pulsed laser, if the laser produces a small number of pulses during the pixel transit time, then dose control may still be poor since pulsed lasers typically produce individual pulses with a small pulse energy jitter. For example, a pulsed laser with a 1% pulse-to-pulse jitter in pulse energy, when used in an intensity modulation technique where a single pulse is allocated to each pixel, will result in a 1% pixel dose error. On the other hand, if 1000 pulses are allocated to each pixel, then the pixel dose error will be far lower since the 1% jitter will be averaged over 1000 pulses.

For the reasons discussed above, when using pulsed lasers with either the intensity modulation or PWM modulation techniques, it is preferred to use a laser which produces a large number of pulses during the transit time between pixels. For example, if a substrate with $10^6$ pixels is desired to be scanned in 10 seconds, then a laser which produces greater than 10, or even greater than 100, pulses per pixel transit time may be preferred in order to achieve acceptable dose control. In this case the laser should produce pulses at a rate greater than 1 MHz, or even greater than 10 MHz.

When using pixel-projection patterning schemes, energy and power are distributed over the entire substrate, so that any heat resulting as a by-product of the UV exposure process is likely to be spread widely and uniformly and thus efficiently conducted away by the wafer chuck system and will not cause substantial increase in temperature of the substrate photoresist film. In the case of the pulsed beam scanning technique, however, wherein each pixel of resist is exposed sequentially with a beam with very high peak pulse power, there is a risk of generating very high temperature pulses in the resist. Careful attention needs to be paid to the effect of thermal excursions in the resist film.

Avoiding temperature variation during laser pulses is important for photolithography in the UV and deep UV (DUV) bands (150 nm to 400 nm), which are commonly practiced with so-called chemically amplified photoresists (CAR). CAR resists are designed such that UV exposure releases a photo-acid, which subsequent heat treatment causes to diffuse through the resist in a chain reaction, efficiently amplifying the original dose distribution. A premature heat input, such as might be imparted to the resist film by exposure to an intense UV pulse, could cause premature acid diffusion and loss of image CD control. Accordingly, very tight CD control is desired during semiconductor manufacturing processes.

Figure 2:
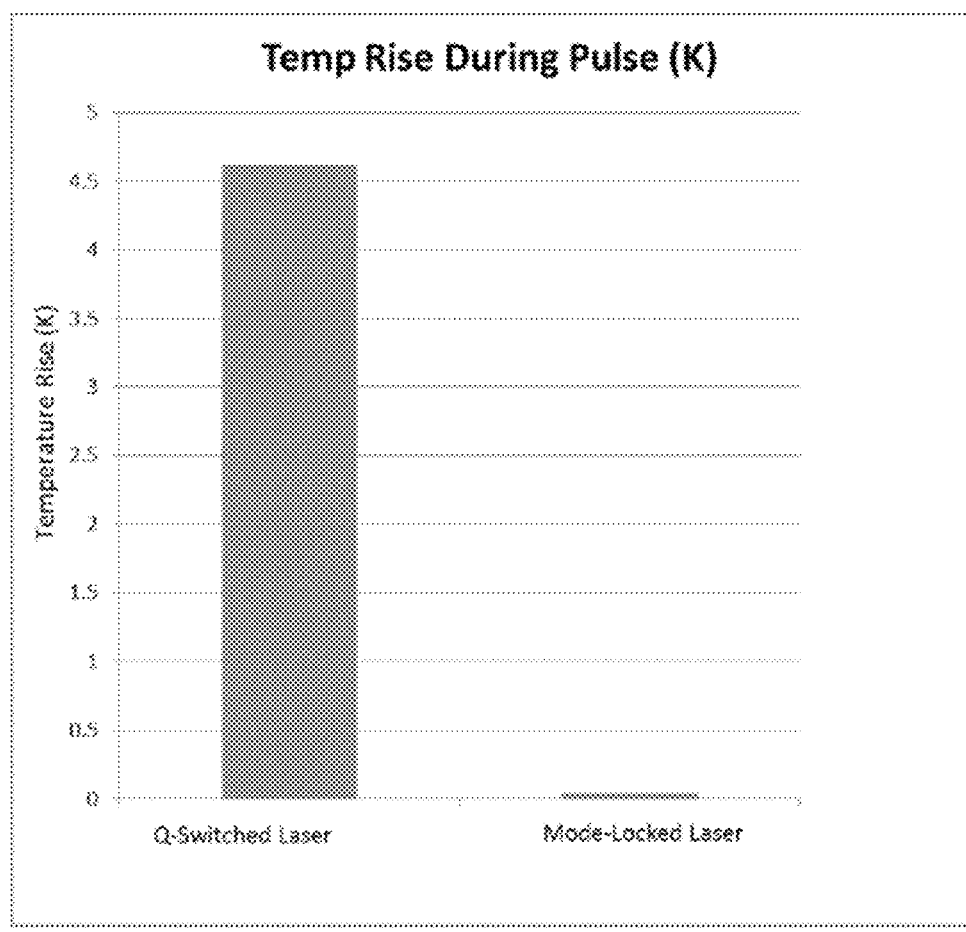
FIG. 2 shows the results of a thermal model of the heat rise in a thin DUV resist.

FIG. 2 shows the results of a thermal model of the heat rise in a thin DUV resist (200 nm thick) coated on a silicon wafer with a 1000 nm-thick $SiO_2$ layer. Using specific parameters of a typical resist, and typical laser parameters (a specific wavelength, a Q-switched laser with 30 kHz pulse frequency, 20 ns pulse length, and 500 mW average power), the model predicts a temperature rise in the resist of 4.6 K. Alternatively, using identical resist parameters and laser wavelength, a mode-locked laser with 100 MHz pulse frequency, 10 ps pulse length, and 200 mW average power, the model predicts a resist temperature rise of just 0.062 K. In this case the mode locked laser produced a temperature rise that was 100× smaller than that produced by the Q-switched laser. Generally, the temperature rise resulting from a Q-switched laser can be 10-100× higher compared to the temperature rise seen with a mode locked laser of equivalent average power. For this reason, a CW laser or a mode-locked laser may be preferred when scanning photoresist films.

Figure 3:
FIG. 3 is an illustration representing an example substrate signature of a property that varies spatially.

FIG. 3 shows a typical substrate signature of CD variations on a wafer, which can be corrected by the deVilliers pixel-based projection method (see U.S. Patent Publ'n No. US 2015/0146178 A1, FIG. 3) or the pixel scanning method of this application. The darker areas of the image (indicating a larger deviation of the CD from intended value) can be adjusted using the methods and apparatuses described herein to become lighter, and therefore resulting in smaller deviations of the CD from the intended values and thus a tighter distribution.

Exemplar Embodiment

One skilled in the art would appreciate that application of the disclosed invention can be realized in many specific embodiments by applying the teachings provided herein. A particular embodiment is described with reference to FIG. 4. Optical bench 400 supports laser 401, for example emitting a beam 402 of wavelength of 266 nm or 512 nm, said beam modulated by AOM 403 for the purpose of beam blanking or grey scale beam blanking. Said beam is then directed by mirrors 404 and 405 to spatial filter 406. A spatial filter is a device well known in the art for cleaning laser beams in order to remove side lobes, noise, and other artifacts, thus rendering the beam in a smoother and more symmetric state. A symmetric, smooth beam, when scanned across a substrate, aids in achieving a regular and smooth addition of accumulated energy dose, resulting in increased control and decreased error of energy deposition. After spatial filter 406, mirrors 407 and 408 direct the beam to a pair of galvanometer mirror scanners 409 and 410. First scanner 409 provides fast scanning along the X axis, whilst second scanner 410 provides slow scanning along the Y axis. A pair of galvanometer scanners arranged in this manner can perform a raster scanning process. Paired galvanometer scanners specifically designed for raster scanning are available from many vendors. The scanned beam is deflected within cone 411 to a substrate 412 for the purpose of energy deposition for film or surface modification. Cone 411 represents the extremes of beam travel enabled by scanners 409 and 410.

The particular embodiment shown in the figure and described herein should not be construed as to restrict the invention to the methods and components described in this specific example. For example, instead of an AOM device, an EOM device could be employed in order to provide beam blanking. Alternatively, beam blanking could be provided by an AOM device that is internal to the construction of the laser. Also, instead of a pair of galvanometer beam deflectors, a pair of AOM beam deflectors could be used. Instead of a mode-locked laser, a Q-switched laser or other type of laser could be used. One skilled in the art could apply any of the types of lasers, modulators, beam deflectors, blanking schemes, and modulation schemes taught herein, singular and in combination, in order to use a scanning light beam for the purpose of energy deposition for film or surface modification.

Figure 4:
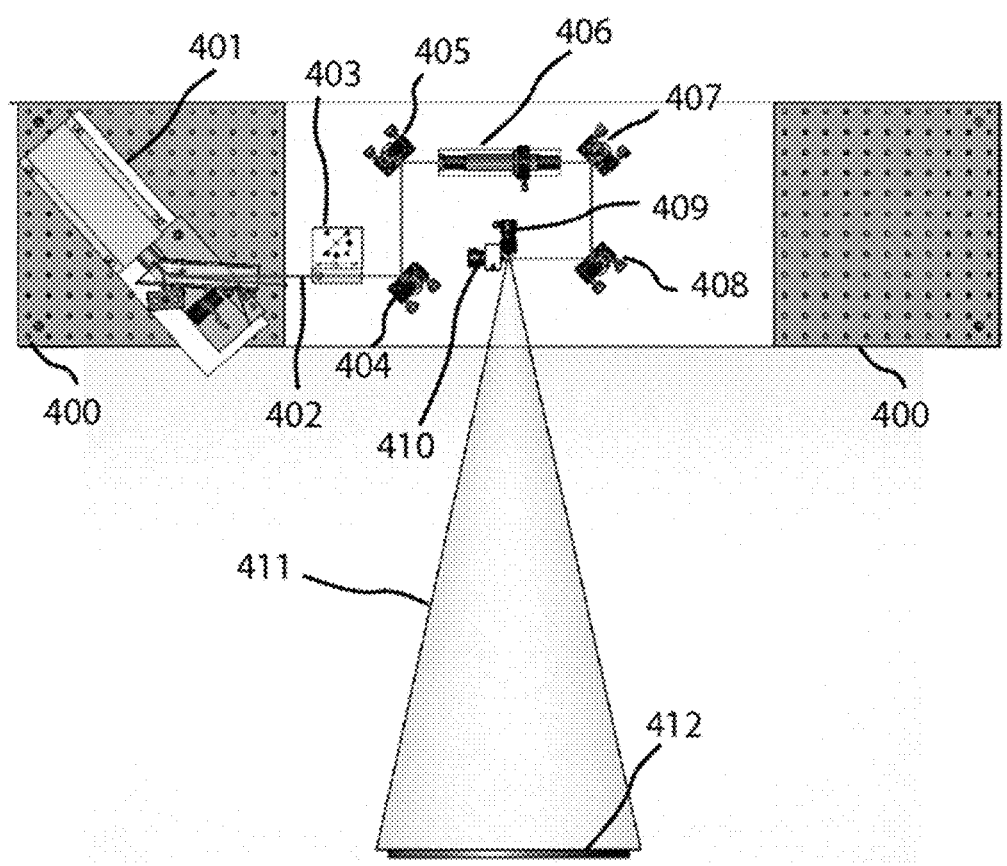
FIG. 4 is a diagram showing the configuration of an apparatus in accordance with an embodiment of the present invention.
Figure 5:
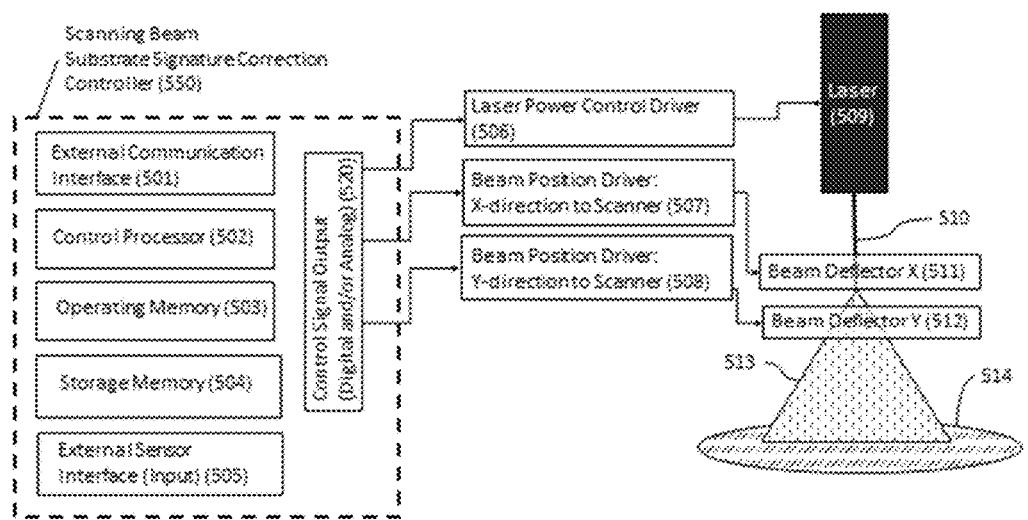
FIG. 5 is a schematic illustration of an example scanning light beam system for tuning a substrate.

Turning to FIG. 5, a Scanning Beam Substrate Signature Correction Controller 550 controls the operation of the apparatus shown in FIG. 4. It includes an external communication interface 501, for example an Ethernet connection or any other type of network or other connection capable of receiving external information; a control processor 502; operating memory 503 providing the needed temporary storage for control processor 502; storage memory 504, such as SRAM, FLASH memory, magnetic or optical disc storage or any other type of memory, to store substrate signature maps, substrate signature correction maps, error corrected signature correction maps, and linearized scan files; external sensor input 505; and a control signal output section 520 providing digital and/or analog output signals used to control beam power and positioning.

A substrate signature map may be in a variety of different formats, including but not limited to a jpeg file, bit map (bmp) file, Excel file, and comma separated value (CSV) file. Generally, regardless of the particular format, the substrate signature map contains, for each position or pixel, the deviation from the target CD value (i.e., the CD error for that position or pixel or group of positions or pixels). A substrate signature correction map may also be in a variety of different formats, including but not limited to a jpeg file, bit map (bmp) file, Excel file, and comma separated value (CSV) file. Generally, regardless of the particular format, the substrate signature map contains, for each position or pixel, the amount of power required to correct the deviation from the target CD value (i.e., the power required to correct the CD error for that position or pixel or group of positions or pixels). In one embodiment, the substrate signature correction map contains for each pixel a value of exposure dose that needs to be imparted by the laser at a specific point on a wafer. For example, for the case of secondary adjustment of the exposure process, the substrate signature map may contain CD error for pixel or group of pixels in nanometer units, and the substrate signature correction map may contain the energy per pixel required to correct the CD error for pixel or group of pixel in units of milli-Joules or milli-Joule/$cm^2$, respectively. In this example, the process of transforming a substrate signature map into a substrate signature correction map requires knowledge of photoresist photochemical exposure parameters which are typically available from photoresist vendors.

A substrate signature correction map may be generated by, for example, an external CD metrology system, as known in the art, and loaded into memory 504 in Scanning Beam Signature Correction Controller 550 via a network connection through external communication interface 501, such as an Ethernet connection. Alternatively, a substrate signature map may be loaded from, for example, an external CD metrology system and transformed into a substrate signature correction map by Scanning Beam Signature Correction Controller 550. Each substrate signature correction map may be loaded concurrently with the time that the wafer 514 is presented to the Scanning Beam Substrate Signature Correction Controller, just prior to the actual exposure. All error correction steps shown in the FIG. 6 flowchart are preferably performed quickly so as to not adversely impact the productivity of the system. Alternatively, a number of 2D substrate signature correction maps, or alternatively linearized and/or error corrected exposure files (described below) can be stored in memory and are then available to be sequenced into the exposure queue as needed.

External sensor interface (input) 505 enables connection to a photodetector sensor which provides periodic monitoring of the output power of laser 509. Lasers may experience slow drift of power output with time which may compromise exposure dose control. Sensor input of laser power enables drift compensation by laser power controller 506 to achieve accurate beam power control during substrate exposure. External sensor interface 505 also enables connection to sensors which monitor the position of wafer 514, for example a camera or photodetector (not shown), which sense wafer position or wafer edge position for the purpose of measuring wafer position error. Compensation of wafer position error can be provided as described below and in FIG. 6.

Control signal output 520 sends control signals to laser power control driver 506, which controls the power level of laser 509. It also sends control signals to a beam position driver that controls the x-direction and y-direction of the beam deflectors in the scanner. In particular, the beam position driver's X-direction 507 is sent to the beam X deflector 511 in the scanner and the beam position driver's Y-direction 508 is sent to the beam Y deflector 517 in the scanner. After beam 510 traverses beam deflectors 511 and 512, scanned beam 513 is directed to substrate 514. The laser power control driver controlling the laser power 506 can do so by providing the suitable input required by the laser manufacturer (for example, a voltage or the duty cycle of a control signal), or by controlling laser power using an external Acousto-Optical Modulator (AOM) such as 403 (FIG. 4). Beam deflectors 511 and 512 are shown in FIG. 4 as Galvanometers 409 and 410, respectively. The associated electronics and drivers required to operate beam deflectors and laser power control are known in the art and not shown in FIG. 4.

Since the system described herein uses a scanned beam and not a projected image, the individual pixels shown in FIG. 3 are preferably arranged in a linear sequence (a linearized substrate signature correction map) allowing the system to impart the required exposure dose at each desired location on the wafer 514. The scanning can be a "back and forth" scan, also known as a boustrophedonic scan, or a single direction "fly-back" scan, where exposure is only in one direction and the beam is quickly brought back to one side of the wafer with the laser turned off. The scanning may also use a vector scanning approach, in which case vector scanning information is stored in the substrate signature correction map.

Figure 6:
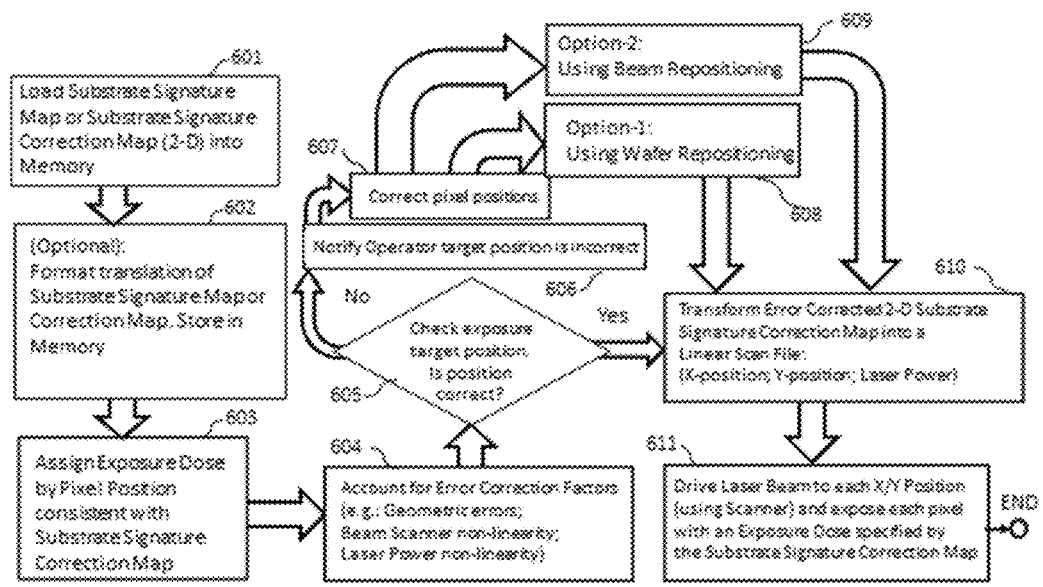
FIG. 6 is a flow chart illustrating a method of substrate signature correction in accordance with an embodiment of the present invention.

Turning to FIG. 6, in step 601, a 2D substrate signature map or substrate signature correction map is loaded into storage memory 504 in Scanning Beam Substrate Signature Correction Controller 550.

In optional step 602, if needed, the format of the substrate signature map or substrate signature correction map is translated into the format required by Scanning Beam Substrate Signature Correction Controller 550 and stored in storage memory 504. For example, if Scanning Beam Substrate Signature Correction Controller 550 requires the map to be in bitmap format, but the loaded map is in, for example, jpeg format, then the map is translated from jpeg format to bitmap format.

In step 603, if a substrate signature map was loaded in step 601, a substrate signature correction map is generated by determining the value of exposure dose for each pixel position that corresponds to the CD error for that position in the substrate signature map—which again may, for example, be based on information available from photoresist vendors. Again, the substrate signature map may be provided in terms of critical dimensions (CD). Deviations from a desired target value can then be expressed by assigning an exposure dose proportional to the adjustment to CD that is required in order to move the observed CD to a target CD.

In step 604, a number of temporal and spatial factors and potential errors may be accounted for, generating error corrected exposure files. These include geometric factors regarding the intersection of beam positions generated by some scanners with the wafer plane, and static and dynamic non-linearity errors of beam scanner parameters typical of differing manufacturing and control methods of scanners. Such scan error terms can differ significantly between scanners of differing manufacturers, with dynamic errors that may be caused by the electronic and mechanical response time of the beam scanners to an external stimulus. Preferably, these delays are considered to assure that the scanner points to the correct location on the wafer at the exact time that the beam power is controlled.

The errors listed here are examples of errors that may be observed and not a complete list of error factors. Additional error corrections may be included. Any error factor causing a deviation of the laser beam position from the desired location can be captured and corrected by the methods described here.

In step 605 the target (typically a wafer) is checked to determine if it is correctly positioned and oriented. This can be done with metrology methods familiar to those in the art. If it is, in step 610, the substrate signature correction map is transformed into a linear scan file, consisting, in one embodiment, of x-position, y-position and required dose for each position of the target scanned.

If the exposure target position and/or orientation is incorrect, the laser would impart the dose at the wrong wafer location. If so, in step 606, a notification of the error is sent to the operator of the controller, or, alternatively, the controller may automatically correct the error. In step 607, the incorrect position/orientation may be corrected using, for example, one or more of the following options: (1) repositioning the wafer correctly (step 608), which can be achieved, for example, using automated loading robots, or (2) repositioning the laser beam (step 609) through shifting and/or rotating the exposure scan positions in software to correct the errors. The choice of correction depends on a number of factors, such as the details of system capabilities and productivity requirements.

In step 610, the error corrected 2D substrate signature correction map is translated into the 1D (linearized) scan file required to drive and control beam power and the scanners according to the scan strategy employed (for example, flyback, boustrophedonic, or vector scan strategies).

In step 611, based on the linearized scan file, the linear sequence of error corrected and linearized beam position and laser beam energy values are provided by the controller 550 to the electronic drivers for the beam scanners and the laser beam energy control, which perform the actual positioning of the laser beam and controls the energy or power of the beam as it moves to the desired location.

After all pixels have been given the desired exposure dose, the system signals the end of the process or proceeds to the next surface modification process.

Those skilled in the art will understand that there can be many variations made to the techniques and apparatus taught herein while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. An apparatus for treating a substrate patterned by a primary process, comprising:
   a laser capable of emitting a beam;
   a beam deflector capable of scanning the beam emitted by the laser across the surface of the substrate, before or after the primary process;
   a beam power or energy control driver;
   a substrate signature correction map containing beam power or energy control information and beam position information for a plurality of positions in the substrate;
   a controller, wherein the controller is configured to output a control signal based on the beam power or energy control information in the substrate signature correction map to the beam power or energy control driver and configured to output the beam position information in the substrate signature correction map to the beam deflector, which in turn scans the beam across the surface of the substrate, causing secondary changes in the substrate as the beam is scanned across the surface.

2. The apparatus of claim 1, wherein the controller comprises:
   a digital processor;
   an external communication interface capable of receiving the substrate signature correction map;
   a storage memory capable of storing the substrate signature correction map; and
   a control signal output capable of outputting the control signal.

3. The apparatus of claim 1, wherein the controller further comprises an external sensor interface.

4. The apparatus of claim 3, wherein the external sensor interface is capable of receiving an input from a sensor that monitors the power of the beam emitted from the laser.

5. The apparatus of claim 3, wherein the external sensor interface is capable of receiving an input from a sensor that monitors the position and/or orientation of the substrate.

6. The apparatus of claim 1, wherein the controller is configured to generate an error corrected exposure file, which is used to adjust the beam power or energy control information and/or the beam position information.

7. The apparatus of claim 6, where the controller further comprises:
   an external sensor interface; and
   wherein the controller is configured to generate the error corrected exposure file based on input received through the external sensor interface and configured to adjust the control signal based on the error corrected exposure file.

8. The apparatus of claim 1, where the controller further comprises:
   an external sensor interface; and
   wherein the controller is configured to determine whether the substrate's position and/or orientation is correct based on input received through the external sensor interface.

9. The apparatus of claim 8, wherein the controller is configured to notify an operator if the substrate position and/or orientation is not correct.

10. The apparatus of claim 8, further comprising:
    an automated loading robot;
    wherein the automated loading robot is configured to reposition the substrate if the substrate position and/or orientation is not correct.

11. The apparatus of claim 8, wherein the controller is configured to reposition the laser beam if the substrate position and/or orientation is not correct.

12. The apparatus of claim 1 wherein the controller is configured to generate a linearized scan file from the substrate signature correction map and the control signal is based on the linearized scan file.

13. The apparatus of claim 1 wherein no lens is required between the beam deflector and substrate to focus the beam on the substrate.

14. The apparatus of claim 1 wherein no lens is required to focus the beam on the surface of the substrate.

15. The apparatus of claim 1, wherein the beam has a pulse rate of greater than 5 kHz.

16. The apparatus of claim 1, wherein the beam has a pulse rate of greater than 10 kHz.

17. The apparatus of claim 1, wherein the laser is a CW laser or a pulsed laser.

18. The apparatus of claim 1, wherein the laser is a Q-switched laser or a mode-locked laser.

19. The apparatus of claim 1, wherein the beam deflector comprises at least one of a spinning multi-faceted mirror, a galvanometer scanning mirror, an AOM beam deflector, an EOM beam deflector, a MEMS scanning mirror and/or a piezo-electric scanning mirror.

20. The apparatus of claim 1, wherein the beam power control driver comprises an AOM, an EOM, a liquid crystal modulator, or a MEMS-based modulator.

21. The apparatus of claim 1, wherein the beam power control driver is a beam blanking device.

22. A method of treating a substrate patterned by a primary process comprising:
scanning a beam of light across a surface of the substrate, before or after the primary process;
varying an amplitude of said light beam by location as it is scanned across the surface based on a substrate signature correction map containing beam power or energy control information and beam position information for a plurality of positions in the substrate; and
wherein said light beam interacts with the substrate causing secondary changes in the substrate based on the amplitude of said light beam as said light beam is scanned across the surface.

23. The method of claim 22, further comprising the steps of:
receiving the substrate signature correction map via an external communication interface; and
storing the substrate signature correction map in a storage memory; and
wherein the step of varying the amplitude of said light beam comprises outputting a control signal to a beam power or energy control driver via a control signal output.

24. The method of claim 22, further comprising the step of:
receiving via an external sensor interface an input from a sensor that monitors the power of the beam emitted from the laser.

25. The method of claim 22, further comprising the step of:
receiving via an external sensor interface an input from a sensor that monitors the position and/or orientation of the substrate.

26. The method of claim 22, further comprising the step of:
receiving an input via an external sensor interface;
generating an error corrected exposure file based on the received input; and
adjusting the beam amplitude based on the error corrected exposure file.

27. The method of claim 26, further comprising the step of:
determining whether the beam amplitude is correct based on an input received through an external sensor interface.

28. The method of claim 25, further comprising the step of:
determining whether the substrate's position and/or orientation is correct based on an input received through an external sensor interface.

29. The method of claim 28, further comprising the step of:
notifying an operator if the substrate position and/or orientation is not correct.

30. The method of claim 28, further comprising the step of:
repositioning the substrate via an automated loading robot if the substrate position and/or orientation is not correct.

31. The method of claim 28, further comprising the step of:
repositioning the laser beam if the substrate position and/or orientation is not correct.

32. The method of claim 22, further comprising the step of:
generating a linearized scan file from the substrate signature correction map; and
wherein the step of varying the amplitude of said light beam based on the substrate signature correction map comprises varying the amplitude of said light beam based on the linearized scan file.

33. The method of claim 22 wherein no lens is required to focus the beam on the surface of the substrate.

34. The method of claim 22, wherein the beam has a pulse rate of greater than 5 kHz.

35. The method of claim 22, wherein the beam has a pulse rate of greater than 10 kHz.

36. The method of claim 22, wherein the beam is generated by CW laser or a pulsed laser.

37. The method of claim 22, wherein beam is generated by a Q-switched laser or a mode-locked laser.

38. The method of claim 22, wherein the step of scanning is performed by at least one of a spinning multi-faceted mirror, a galvanometer scanning mirror, an AOM beam deflector, an EOM beam deflector, a MEMS scanning mirror and/or a piezo-electric scanning mirror.

39. The method of claim 22, wherein the step of varying the amplitude of said light beam is performed by an AOM, an EOM, a liquid crystal modulator, or a MEMS-based modulator.

40. The method of claim 22, wherein the step of varying the amplitude of said light beam is performed by a beam blanking device.

* * * * *